(12) United States Patent
Hayashida et al.

(10) Patent No.: US 7,993,452 B2
(45) Date of Patent: Aug. 9, 2011

(54) METHOD OF MANUFACTURING EPITAXIAL SILICON WAFER

(75) Inventors: Koichiro Hayashida, Kanagawa (JP); Kazuhiro Narahara, Kanagawa (JP); Hirotaka Kato, Kanagawa (JP)

(73) Assignee: Sumco Techxiv Corporation, Kanagawa (JP)

( * ) Notice: Subject to any disclaimer, the term of this patent is extended or adjusted under 35 U.S.C. 154(b) by 1159 days.

(21) Appl. No.: 11/731,268

(22) Filed: Mar. 30, 2007

(65) Prior Publication Data

US 2007/0228524 A1 Oct. 4, 2007

(30) Foreign Application Priority Data

Mar. 31, 2006 (JP) ................................. 2006-100921

(51) Int. Cl.
 *C30B 21/04* (2006.01)
(52) U.S. Cl. .................... 117/2; 117/3; 438/750; 216/45
(58) Field of Classification Search .................. 117/2, 3; 438/750; 216/45
 See application file for complete search history.

(56) References Cited

U.S. PATENT DOCUMENTS

| 5,071,776 A | * | 12/1991 | Matsushita et al. | 438/460 |
| 5,451,547 A | * | 9/1995 | Himi et al. | 438/455 |
| 5,990,022 A | * | 11/1999 | Motoura et al. | 438/10 |
| 6,200,872 B1 | | 3/2001 | Yamada | |
| 7,182,809 B2 | | 2/2007 | Haga et al. | |
| 7,537,658 B2 | | 5/2009 | Nasu et al. | |
| 2007/0093072 A1 | | 4/2007 | Fukuda et al. | |
| 2007/0169683 A1 | | 7/2007 | Haga et al. | |
| 2008/0131605 A1 | | 6/2008 | Nasu et al. | |

FOREIGN PATENT DOCUMENTS

| JP | 11-168106 | 6/1999 |
| JP | 11-274162 | 10/1999 |
| JP | 2002-020200 | 1/2002 |
| JP | 2004-119446 | 4/2004 |
| JP | A-2004-356416 | 12/2004 |
| JP | A-2005-311053 | 4/2005 |
| JP | A-2005-197278 | 7/2005 |
| JP | 2005-244127 | 9/2005 |

OTHER PUBLICATIONS

File History from U.S. Appl. No. 11/793,155 (Total pp. 227).
File History from U.S. Appl. No. 11/793,155 from Oct. 27, 2008 to Present (29 pages).
Office Action from corresponding Japanese Application No. 2006-100921 dated Nov. 30, 2010.

* cited by examiner

*Primary Examiner* — Robert M Kunemund
(74) *Attorney, Agent, or Firm* — Alston & Bird LLP

(57) ABSTRACT

A role of a bottom face of a silicon wafer is identified in a manufacturing process of the silicon wafer. And preferable characteristic feature is also identified. In order to obtain the above characteristic feature, a process method to be implemented into the method of manufacturing a normal silicon wafer is provided. For example, the method comprises: a pre-cleaning process for cleaning the silicon wafer having top and bottom faces processed to a mirror finish; and a rapid thermal process or an epitaxial growth process, wherein the pre-cleaning process comprises a hydrofluoric acid (HF) process and a subsequent pure water (DIW) process.

6 Claims, 9 Drawing Sheets

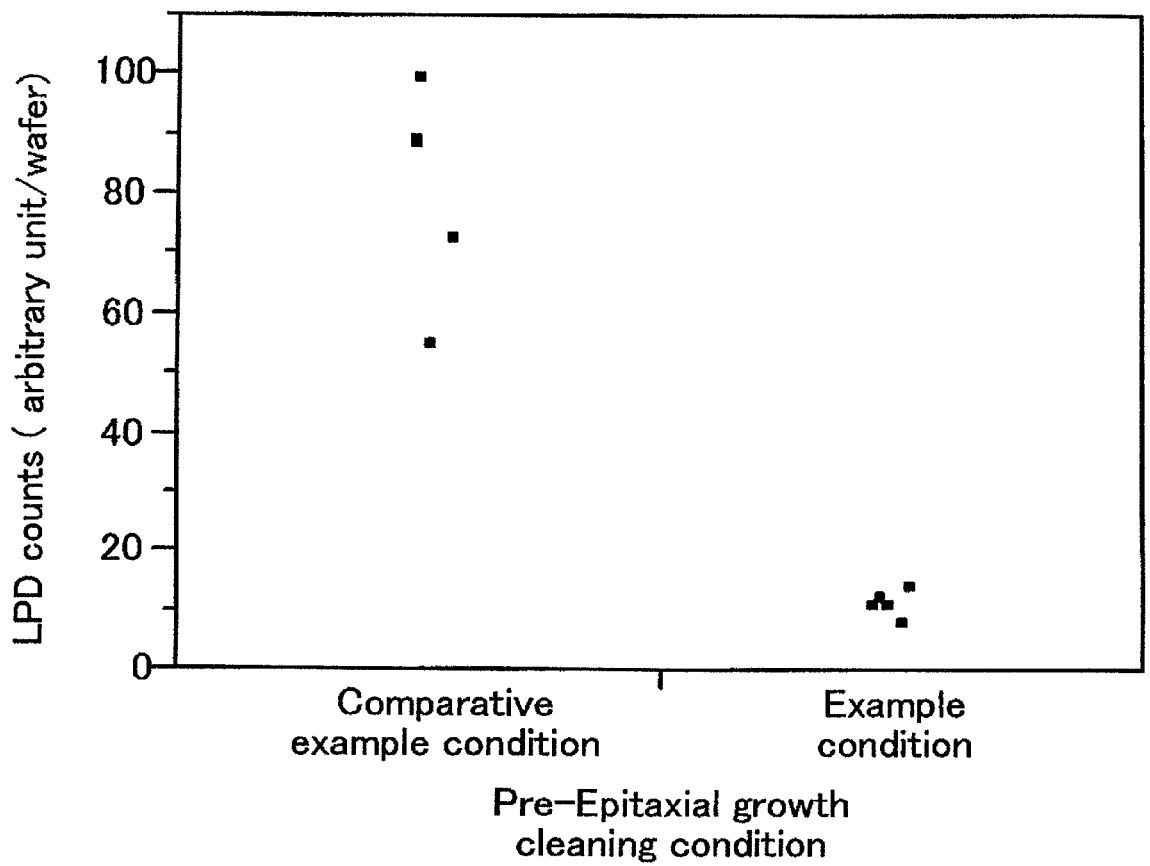

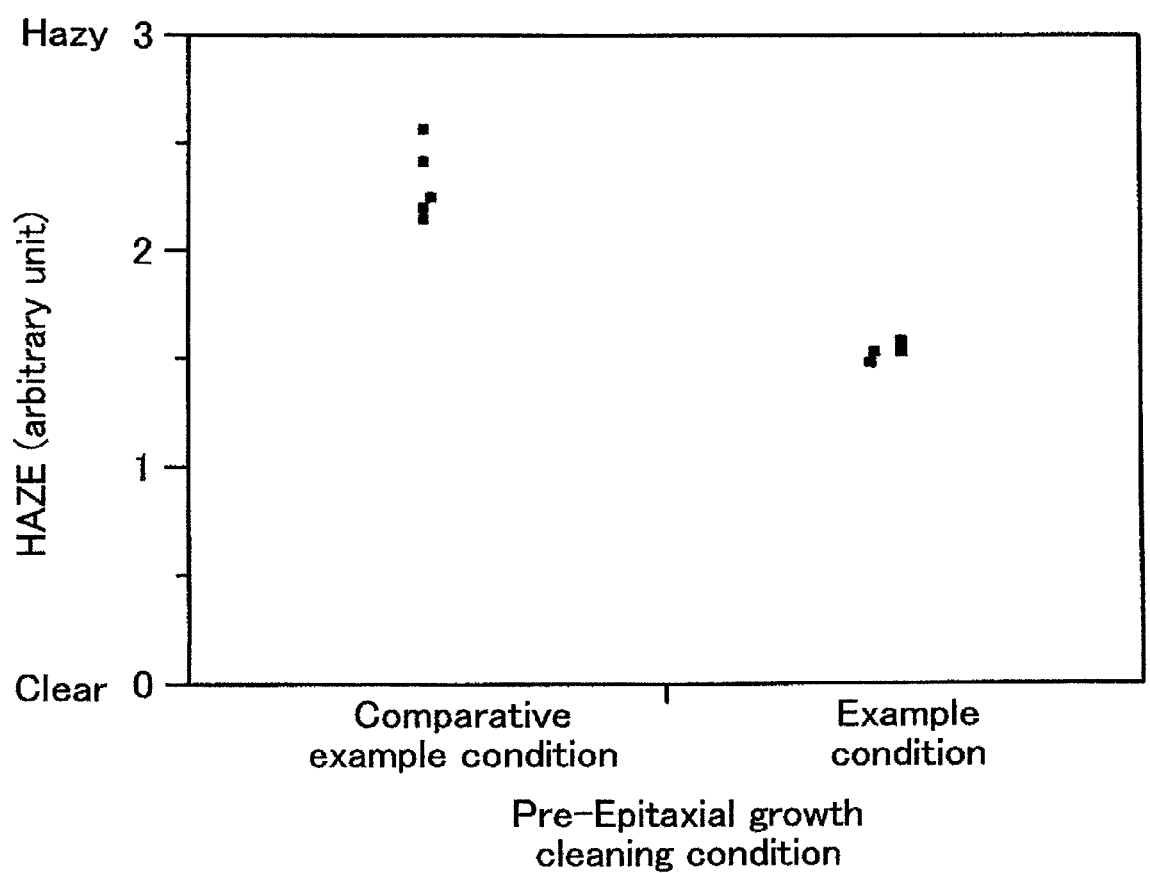

US 7,993,452 B2

METHOD OF MANUFACTURING EPITAXIAL SILICON WAFER

CROSS REFERENCE TO RELATED APPLICATIONS

This application is based upon and claims the benefits of priority from Japanese Patent Application No. 2006-100921 filed on Mar. 31, 2006, the entire contents of which are incorporated herein by reference.

1. Field of the Invention

The present invention relates to a method of manufacturing a silicon wafer. And more specifically, it relates to a method of cleaning the silicon wafer.

2. Related Art

When a silicon epitaxial layer is formed on a top surface of a silicon single crystal substrate, for example, the silicon single crystal substrate which has been processed in a prescribed cleaning process is placed on a susceptor in a reaction chamber in which a vapor phase growth is conducted. And a natural oxide film formed on the top surface of the silicon single crystal substrate is removed by etching with hydrogen as the inside of the reaction chamber is heated (e.g., in a range from 1100 degree Celsius to 1200 degree Celsius) for hydrogen anneal process. Next, the inside of the reaction chamber is held in a growth temperature range (e.g., from 1050 degree Celsius to 1150 degree Celsius), and a silicon source gas is provided over a main surface (top surface) of the silicon single crystal substrate, and then a silicon epitaxial layer is formed on the top surface of the silicon single crystal substrate by a vapor phase epitaxy so as to manufacture a silicon epitaxial wafer (for example, refer to Japanese Unexamined Patent Application Publication Nos. 2005-197278 and 2005-311053).

On the other hand, the bottom face of the silicon single crystal substrate has not been paid much attention to with respect to the features and characteristics or the treatment. However, as the technologies have been developed in recent years, the quality of the bottom face has become of great interest such that both top and bottom surfaces may be processed to a mirror finish. Although the features and characteristics of the bottom face are of great interest and the features and characteristics of the top face have been analyzed in detail, it has not been clarified how the features and characteristics of the bottom face affect the properties of the silicon wafer as a whole. Also, in the prescribed cleaning process as described above, the process is usually conducted in a wet condition such that it has been assumed that the same cleaning effects are realized on both top and bottom surfaces and that the same treatment effects are realized on both top and bottom surfaces in the subsequent hydrogen annealing process likewise.

However, the present inventors have found that the above-mentioned assumption is not necessarily correct if the properties, in particular, the optical properties of the bottom surface are concerned. Also, a closer analysis has been made about the role of the bottom face in the manufacturing process of the silicon wafer such that preferable properties of the bottom surface and a process method to obtain such preferable properties have been found.

On the other hand, in Japanese Unexamined Patent Application Publication No. 2004-356416, it is disclosed that ozone oxide films are formed on both main faces of the silicon single crystal substrate with an aqueous ozone solution after the silicon single crystal substrate is processed in the SC1 cleaning process (process with a mixture of aqueous ammonia solution and hydrogen peroxide solution). However, since the silicon single crystal substrate is not processed with a hydrofluoric acid, the ozone oxide films are unnecessarily strong such that the effects in the following processes may be reduced or blocked.

SUMMARY OF THE INVENTION

In consideration of the above-mentioned cases, the role of the bottom face in the manufacturing process of the silicon wafer is more clarified such that preferable properties of the bottom face may be grasped. And the treatment process, which may be implemented in the regular manufacturing method of the silicon wafer so as to yield such properties, is provided.

In the present invention, a base silicon wafer to have both top and bottom surfaces processed to a mirror finish may be processed in a cleaning process preceding a heater process of the rapid thermal process (RTP) or an epitaxial growth process wherein the cleaning process may comprise the steps of processing the silicon wafer with a hydrofluoric acid (HF) and processing the same with deionized water (DIW) at the last stage. In a silicon wafer used for a state-of-art device, in particular, a double-mirror-finish wafer with two sides (i.e., top and bottom surfaces) processed to a mirror finish, the quality of the bottom surface such as cleanliness about particles and impurities, flatness, and micro-roughness is as important as that of the top surface.

Further features of the present invention, its nature, and various advantages will be more apparent from the accompanying drawings and the following description of the preferred embodiment.

BRIEF DESCRIPTION OF THE DRAWINGS

FIG. 8 is a drawing showing a graph indicating numbers of particles on a bottom face of a wafer obtained by an epitaxial growth.

FIG. 9 is a drawing showing a graph indicating HAZE level of the bottom face of the wafer obtained by an epitaxial growth.

DESCRIPTION OF THE PREFERRED EMBODIMENT

A preferred embodiment of the present invention will be described in detail below with reference to the accompanying drawings. Here, like numeral references refer to like elements and duplicated explanations will be omitted.

Figure 1:
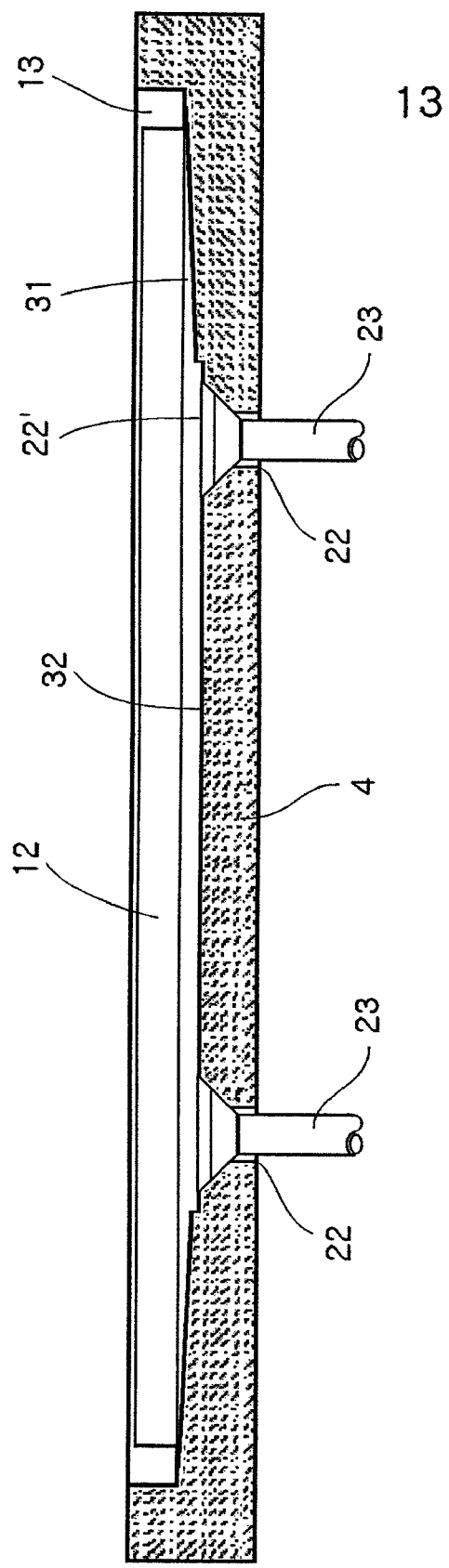
FIG. 1 is a longitudinal section view showing a general appearance of a susceptor.

FIG. 1 is a drawing illustrating schematically a longitudinal section view of a susceptor 4. An bottom part of a pocket 13 as an opening part of the susceptor 4 is composed of a shelf and a taper face. For example, in the device for processing a wafer of a 300-mm diameter to form an epitaxial layer thereon, a disk-like member of a diameter from 350 to 400 mm and a thickness from 3 to 6 mm is used as a susceptor 4.

The pocket 13 as a circular recess member is provided 20-40 mm inside from an outer periphery on the top face of the susceptor 4 to form a circular opening of the circular recess member where a semiconductor wafer 12 is received. The pocket 13 is also provided with a taper face 31 at the bottom. The taper face 13 comprises a gentle slope.

The pocket 13 further provided with a shelf part 32 as a circular recess part at the bottom inside the taper face 31. The shelf part 32 is a circular flat face provided at a little lower position from the taper face 31 and is a horizontal face parallel to the top face of the susceptor 4.

Figure 2:
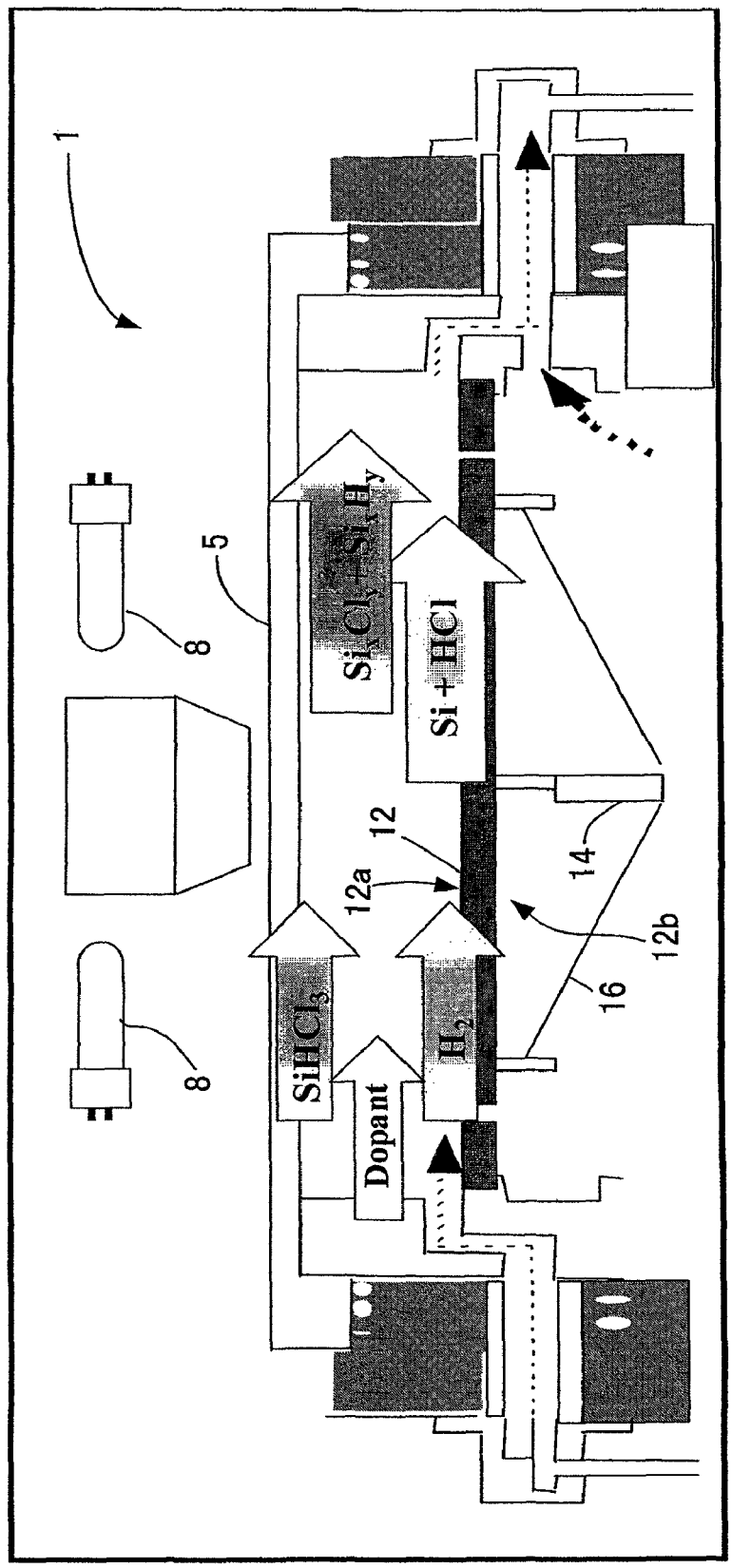
FIG. 2 is a schematic view of an epitaxial wafer manufacturing device.

In FIG. 2, an epitaxial manufacturing device using a similar susceptor 4 is illustrated. A susceptor support shaft 14 is positioned and aligned to have the common center of the disk shape of the susceptor 4 such that the susceptor 4 is rotated as the susceptor support shaft 14 is rotated. The susceptor support shaft 14 is rotated by a rotation driving mechanism (not shown). The susceptor support shaft 14 and a susceptor arm are made of transparent quartz so as not to block the light from a lower heat source.

(Epitaxial Growth)

FIG. 2 illustrates schematically a method of forming an epitaxial layer on a top face of the semiconductor wafer (silicon single crystal wafer) 12. A source gas for the growth flows from left to right mainly over the top face of the semiconductor wafer 12 (i.e., silicon single crystal wafer). The semiconductor wafer 12 is heated on the top face by lamps 8. Therefore, it is expected that thermal energy to increase the supply rate and the reaction rate of hydrogen as a reactive gas on the bottom face is less than that on the top face since the bottom face is usually covered with the susceptor or other instruments during a hydrogen annealing process in which a hydrogen gas flows instead of a growth gas although the reaction rate may be enhanced on the top face.

Figure 3:
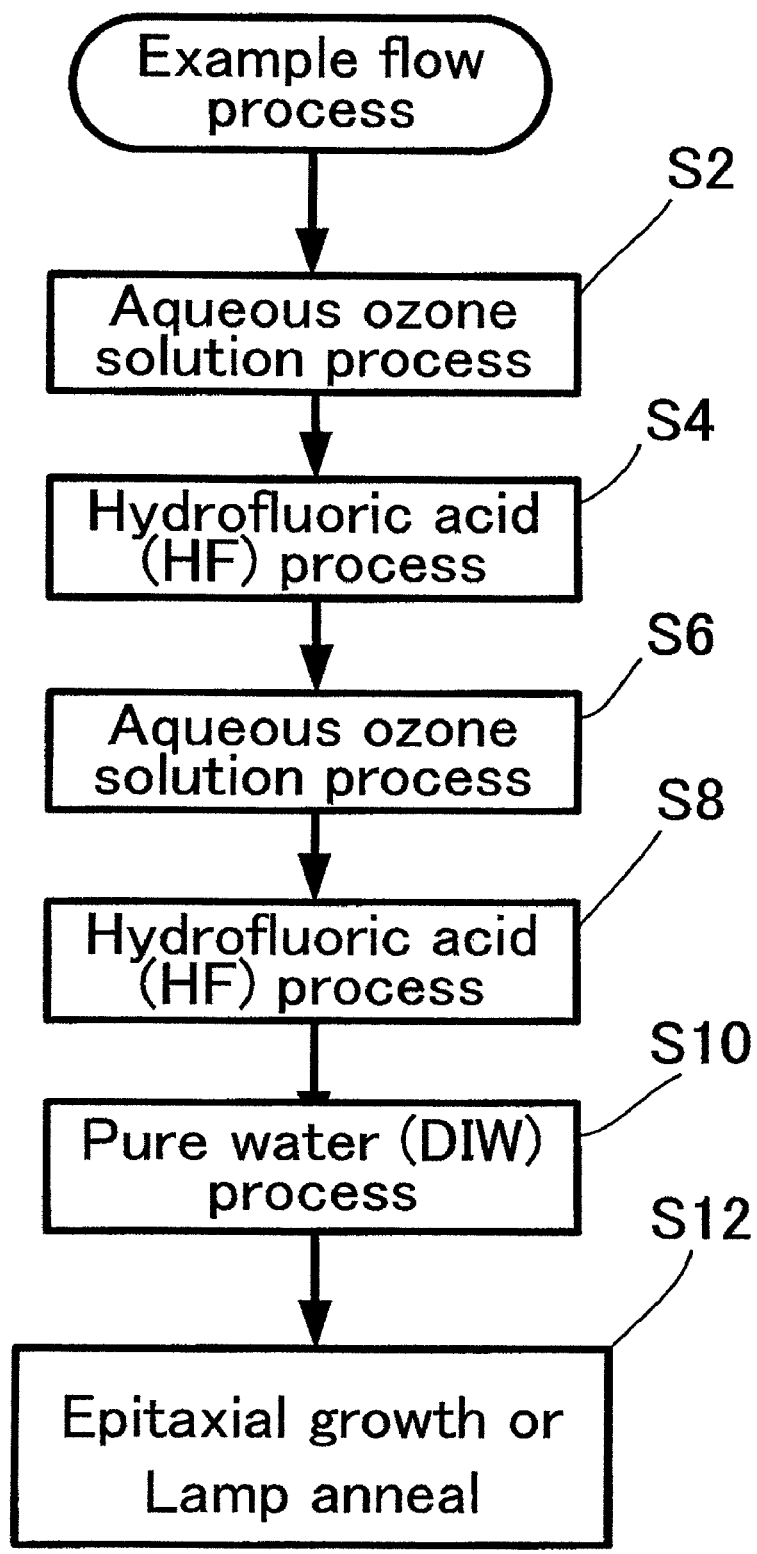
FIG. 3 is a drawing showing a flow chart of an example.

FIG. 3 illustrates a flow chart of an embodiment according to the present invention. First, the semiconductor wafer (silicon single crystal wafer) with the top and bottom faces processed to the mirror finish is processed (or treated) with an aqueous ozone solution (S2). Here, organic matter and particles on the surfaces are removed in this process. And the surfaces of the semiconductor wafer are oxidized. This oxidization occurs on both top and bottom surfaces. For example, the oxidization may also be conducted by dipping the semiconductor wafer into a chemical tank containing ammonium hydroxide-hydrogen peroxide solution (SC-1 cleaning).

Next, the semiconductor wafer is processed (or treated) with hydrofluoric acid (HF). Here, the oxide films on the surfaces of the semiconductor wafer are removed in this process. In general, the silicon wafer is soaked in approximately 1% of dilute hydrofluoric acid for several to several tens seconds (S4). Here, metallic and ionic impurities are mainly removed in the process.

Further, the silicon wafer is processed (or treated) with another aqueous ozone solution again (S6). Here, oxide films are mainly formed on the surfaces in this process. And then, the wafer is processed (or treated) with hydrofluoric acid in a similar manner (S8). Here, the oxide films on the surfaces are mainly removed in this process. The wafer is rinsed with pure water (deionized water) in the last stage (S10) and the processed wafer is transferred to the next process such as an epitaxial growth process or a lamp anneal process (S12). In these processes, the oxide films on the surfaces formed in the pure water process, can be adequately removed under a milder condition of the hydrogen annealing process than that required for the oxide films on the surfaces formed in the aqueous ozone solution process. As mentioned above, in the method of the embodiment according to the present invention, the process with the hydrofluoric acid (HF) and the subsequent process with pure water (DIW: deionized water) are used in the pre-cleaning process before the rapid thermal process (RTP) or the epitaxial growth process. Here, it is more preferable to process (or treat) the wafer only on the bottom face (or surface) with the hydrofluoric acid (HF) and subsequently with the pure water (DIW). These processes can be realized by spraying a processing liquid or a vapor thereof (spin cleaning) on the bottom surface instead soaking the semiconductor wafer 12 in a tank containing a processing liquid.

Here, the process (S8) with the hydrofluoric acid (HF) can be conducted by soaking the wafer 12 in a tank containing dilute hydrofluoric acid or by injecting or showering the dilute hydrofluoric acid mainly on the bottom face. Also, the process (S10) with the pure water (DIW) can also be conducted by soaking the silicon wafer in the pure water, or by injecting or showering the pure water mainly on the bottom face.

Figure 4:
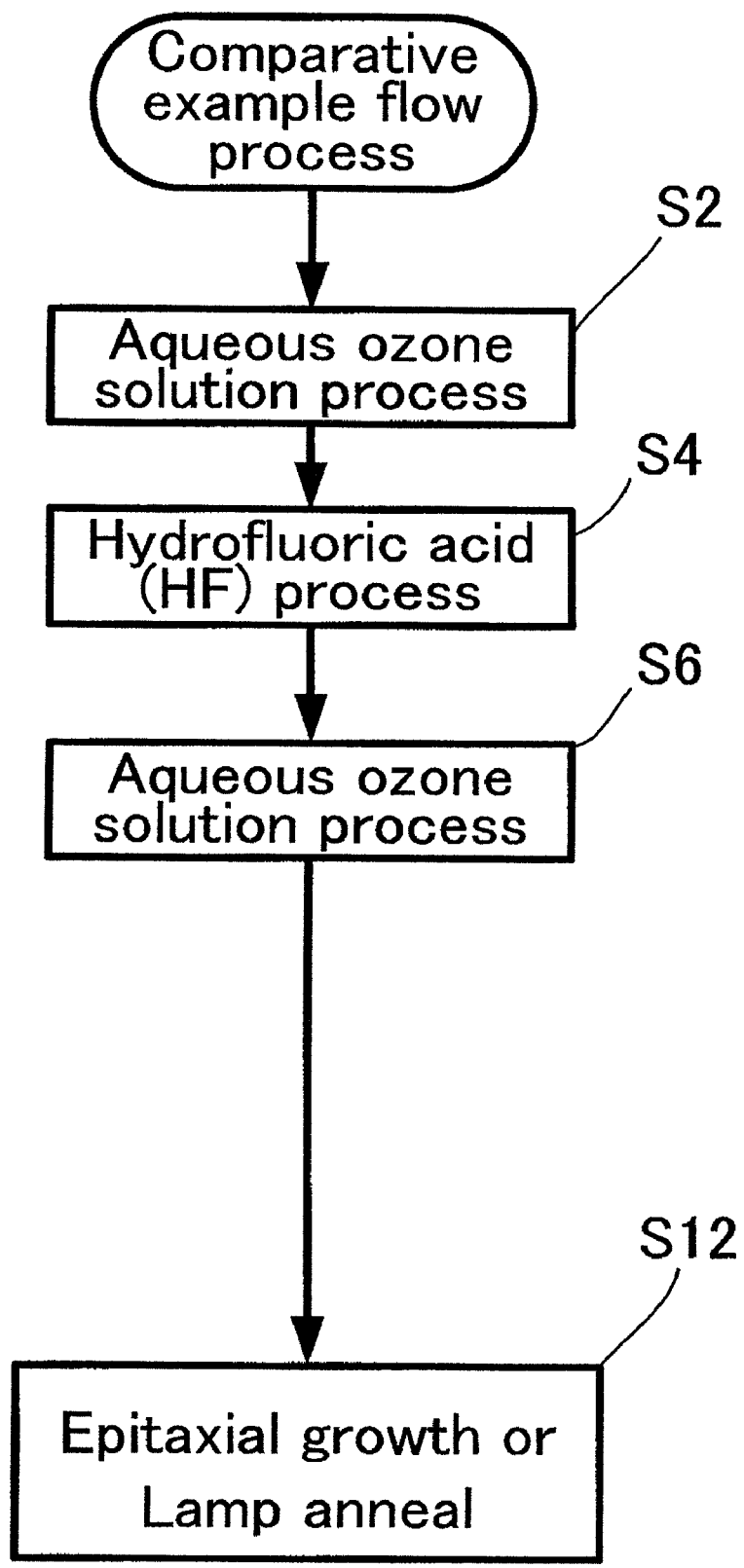
FIG. 4 is a drawing showing a flow chart of a comparative example.

FIG. 4 illustrates a flow chart of a comparative example. In the flow chart of the comparative example, the semiconductor wafer (silicon single crystal water) is first processed with the aqueous ozone solution (S2) so that the organic matter and particles are mainly removed. At the same time, the surfaces (both top and bottom surfaces) of the semiconductor wafer are oxidized. For example, both surfaces are processed in the same way since the semiconductor wafer is soaked into the chemical tank containing ammonium hydroxide-hydrogen peroxide solution (SC-1 cleaning). Next, the silicon wafer is processed with the hydrofluoric acid (HF) as the wafer is soaked in the approximately 1% of dilute hydrofluoric acid for several to several tens seconds such that the oxide films formed on the surfaces of the semiconductor wafer are removed (S4). Here, metallic and ionic impurities are mainly removed from both surfaces in a similar manner. The wafer is further processed with the aqueous ozone solution in the same way as mentioned above such that surface oxide films are formed (S6). Then, the wafer is moved to the next epitaxial growth process or lamp anneal process (S12). However, the flow chart of the comparative example lacks the process (S8) with the hydrofluoric acid and the process (S10) with the pure water as shown in FIG. 3 such that the thus-yielded oxide films may not be removed adequately since the oxide film removing condition on the bottom surface is milder than that on the top surface. Such flow chart of the comparative example may also be used for the semiconductor wafer having the bottom surface which is not subject to the mirror finish.

Here, it is possible to use the process with the pure water such as the process S10 (shown in FIG. 3) instead of the second process with the aqueous ozone solution as shown in FIG. 4. In such a case, the last stage of the pre-cleaning process comprises the process with the hydrofluoric acid and the subsequent process with the pure water. Thus, this pre-cleaning process may be another embodiment of the present invention. However, it is more preferable not to omit the process (S6) with the hydrofluoric acid in order to form a adequately protective oxide film on the top surface.

Figure 5:
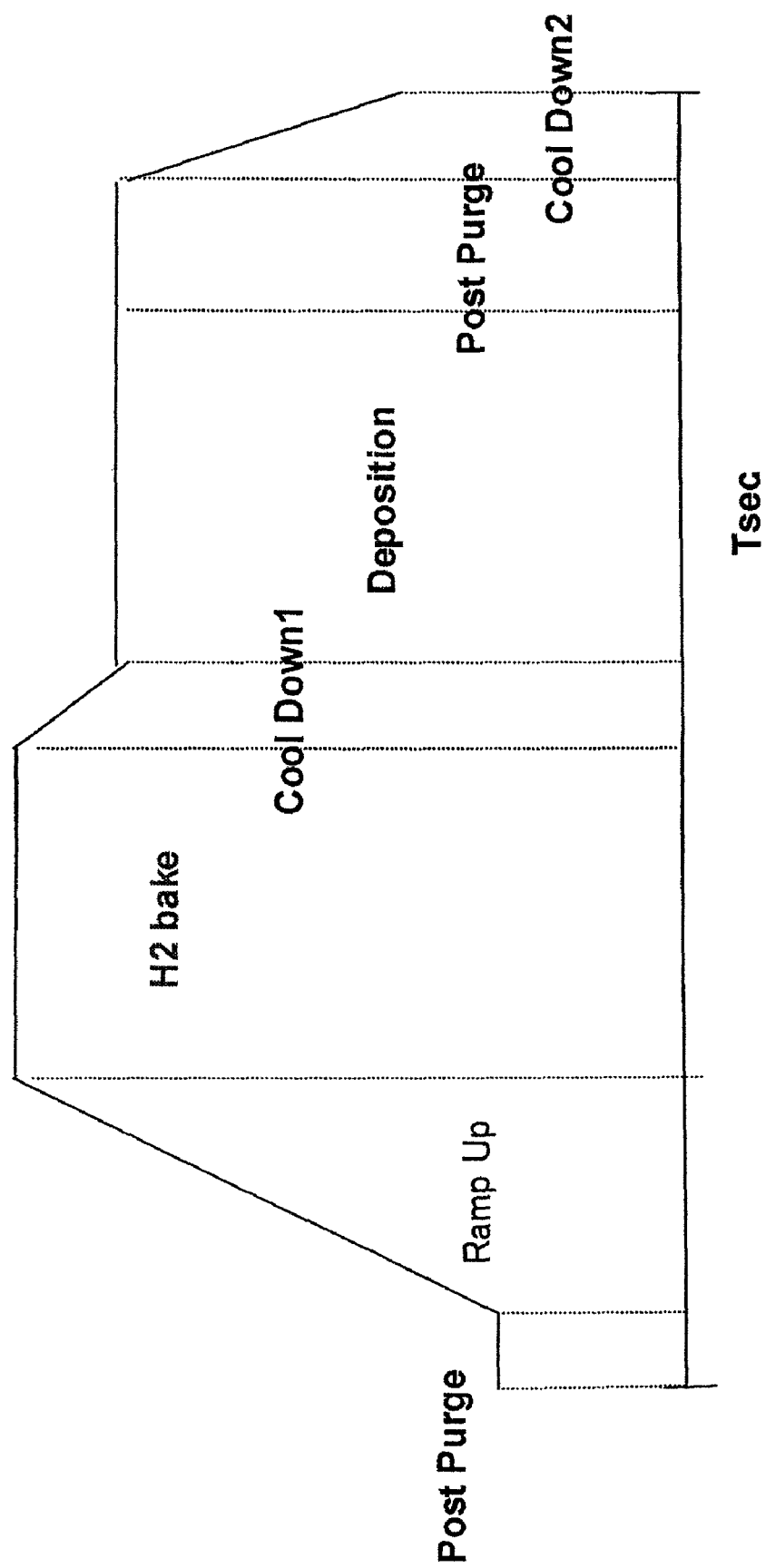
FIG. 5 is a drawing showing a temperature diagram in an epitaxial growth process and a hydrogen annealing process.

FIG. 5 shows a sample epitaxial growth process among the epitaxial growth process and the lamp anneal process in the step S12. The horizontal axis indicates time and the vertical axis shows the temperature such that the steps are chronologically shown from left to right and that the temperature is higher as the solid line goes up. First, the semiconductor wafer 12 is placed into the chamber 2 of the epitaxial wafer manufacturing device 1 and the ambient atmosphere is adjusted. Next, the temperature is increased rapidly such that the hydrogen annealing process is conducted. In the hydrogen annealing process, the protective oxide films on both top and bottom surfaces are removed. Then, the epitaxial layer growth is conducted and the thus-obtained epitaxial wafer is cooled down and removed from the chamber.

EXPERIMENTAL EXAMPLE

Now, details of the experimental examples that were actually made are explained. Silicon single crystal wafers having diameters of 200 mm and 300 mm were prepared as both surfaces of the respective wafers were processed to the mirror finish. These wafers were processed according to the flow charts as shown in FIGS. 3 and 4. Here, the process (S8) with the hydrofluoric acid (HF) was conducted by soaking the wafers into the approximately 1% dilute hydrofluoric acid for several to several tens seconds. Also, the process (S10) with the pure water (DIW) was conducted by showering the pure water onto the silicon wafer such that the wafer was rinsed with the pure water. In the step S12, the epitaxial growth was conducted under the aforementioned condition. Here, the aforementioned hydrofluoric acid process (S8) was also conducted by the spin cleaning as the approximately 1% of dilute hydrofluoric acid was showered onto the bottom surface of the silicon wafer. The evaluation results of such silicon wafers subject to the spin cleaning are not plotted in the graphs, but showed almost the same results.

Figure 6:
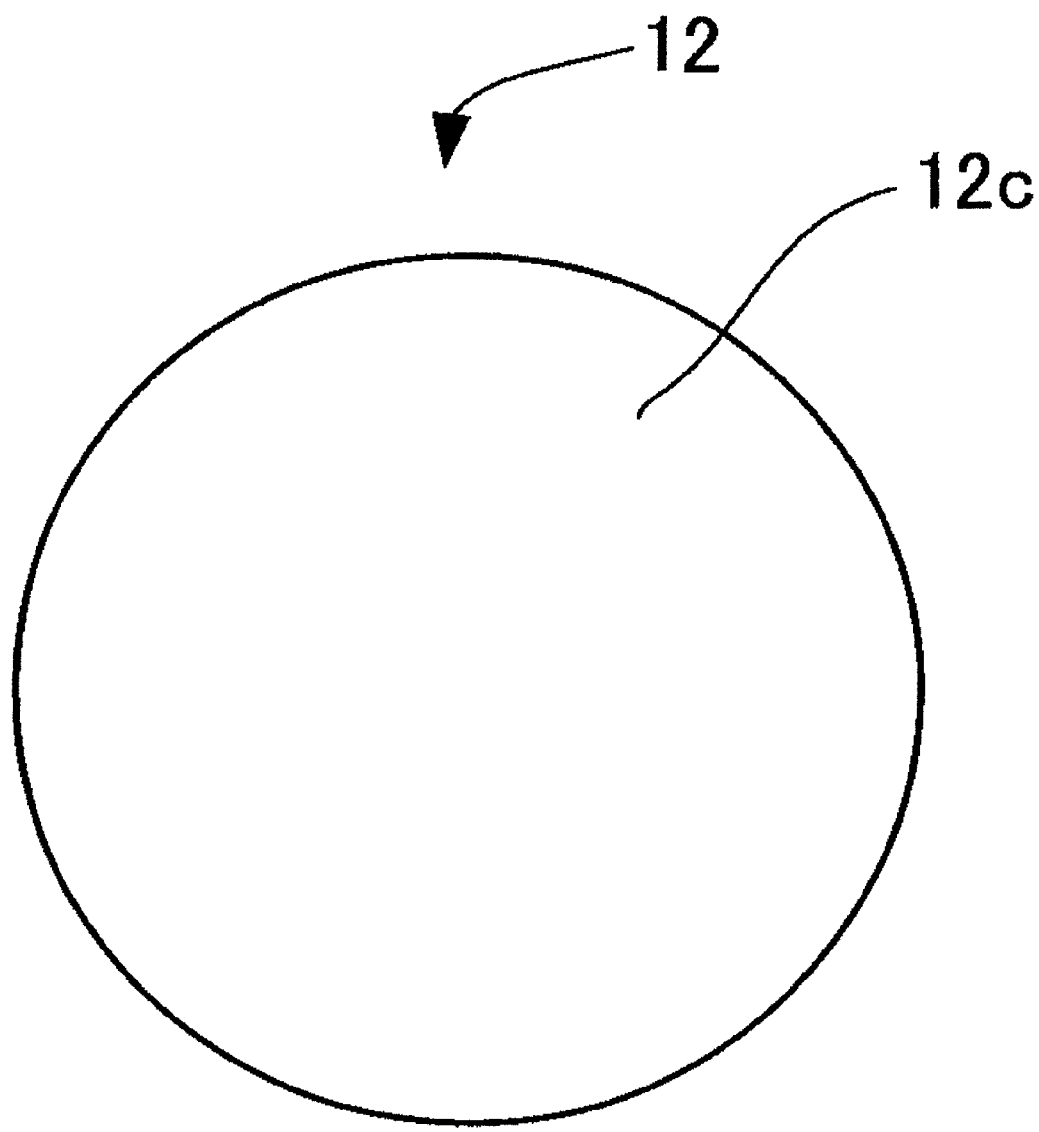
FIG. 6 is a drawing showing schematically a bottom face of a silicon epitaxial wafer obtained in a process of an example.
Figure 7:
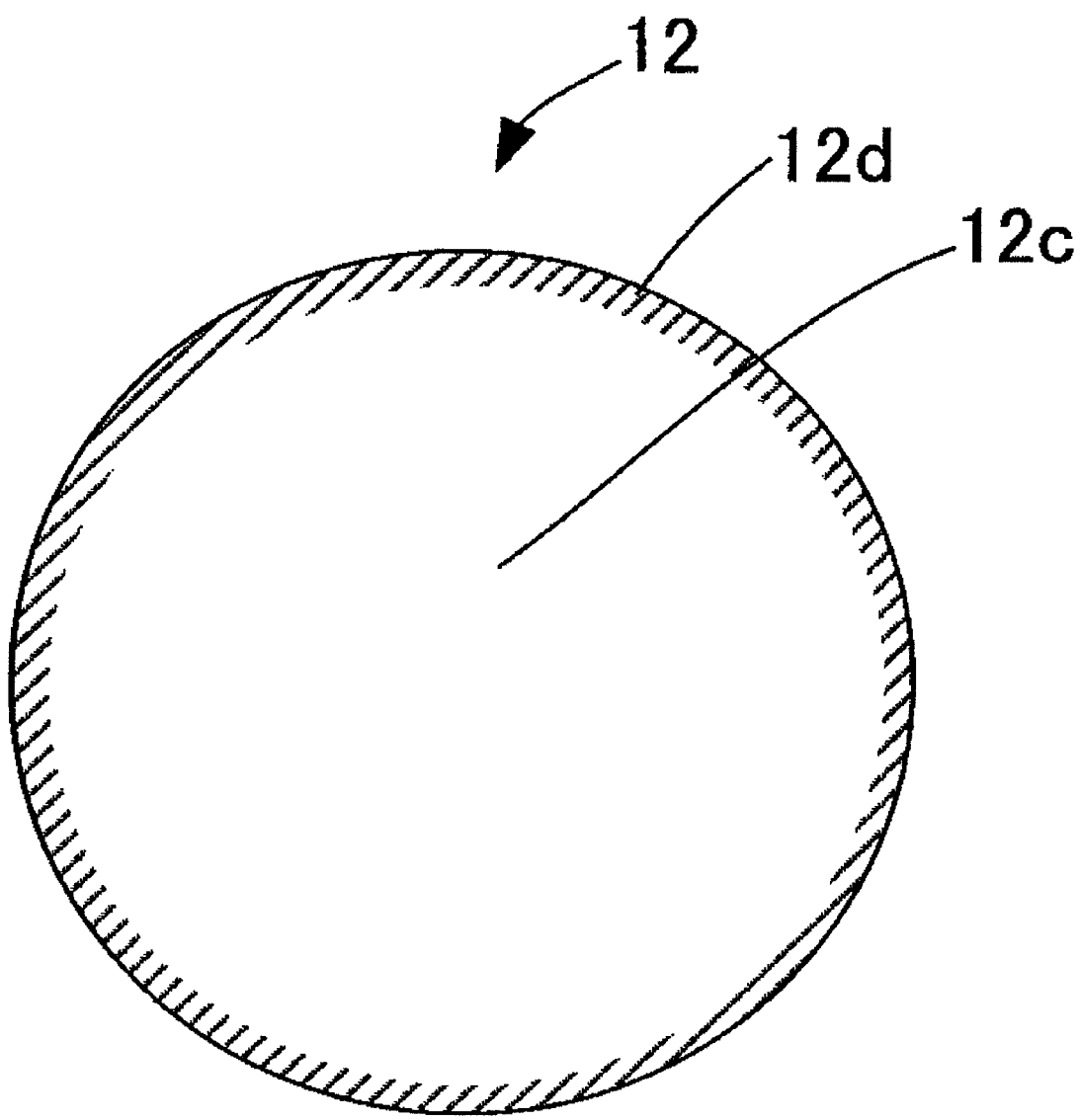
FIG. 7 is a drawing showing schematically a bottom face of a silicon epitaxial wafer obtained in a process of a comparative example.

FIGS. 6 and 7 illustrate schematically the bottom faces of the epitaxial silicon wafers obtained as mentioned above. FIG. 6 illustrates the bottom face of the wafer cleaned in the processes of the embodiment (FIG. 3) according to the present invention and FIG. 7 illustrates the bottom face of the wafer cleaned in the processes of the comparative embodiment (FIG. 4). FIG. 7 illustrates clouded place by a shaded area 12d in a peripheral portion. The other place is a non-clouded area 12c. As shown in FIG. 6, there was no clouded place on the entire bottom face (12c). As mentioned above, no clouded place was yielded on the bottom face in the method of the embodiment according to the present invention.

FIG. 8 shows a graph on which numbers of particles on the bottom faces of the epitaxial silicon wafers as grown from silicon single crystal wafers with double sides processed to the mirror finish after the processes shown in FIGS. 3 and 4 were conducted, respectively. The vertical axis indicates the number of count of particles per unit wafer and the right group of plots shows results of the wafers processed in the pre-cleaning process according to the flow chart as shown in FIG. 3 whereas the left group of plots shows results of the wafers processed in the pre-cleaning process according to the flow chart as shown in FIG. 4. Generally speaking, since the absolute number of particles may vary depending on the measurement conditions, measurement results of the silicon wafers under the same measurement conditions are plotted for comparison in FIG. 8. As shown in FIG. 8, it is clear that the numbers of particles on the bottom faces of the epitaxial silicon wafers subject to the pre-cleaning process of the embodiment according to the present invention are extremely small.

FIG. 9 shows haze levels on the bottom faces of the epitaxial silicon wafers after the processes as shown in FIGS. 3 and 4 were conducted, respectively in the same manner as mentioned above. The vertical axis shows how high the haze level is. As mentioned above, since the haze level may also vary depending on the measurement conditions, measurement results of the silicon wafers under the same measurement conditions are plotted for comparison. In a similar manner as mentioned above, the measurement results of wafers subject to the processes of the embodiment according to the present invention and of the comparative embodiment, respectively, for comparison. As shown in the graph, the haze level of the bottom faces of the epitaxial silicon wafer processed in the pre-cleaning process of the embodiment according to the present invention is improved if compared to that of the comparative example.

Further, the following may be included in the present invention.

(1) A method manufacturing a silicon wafer comprising: a pre-cleaning process for cleaning a silicon wafer with top and bottom faces polished to a mirror finish; a rapid thermal process (RTP) or an epitaxial growth process, wherein the pre-cleaning process comprises a process with hydrofluoric acid (HF) and a subsequent process with pure water (DIW).

In the final cleaning process of the mirror finish process of the silicon wafer, both top and bottom faces are usually oxidized and etched repeatedly with ammonium hydroxide-hydrogen peroxide solution or aqueous ozone solution, and hydrofluoric acid, respectively, so as to build a protective oxide film having the thickness of several tens angstrom. The above process is made as the pre-cleaning process and the protective oxide film built in the pre-cleaning process is typically removed under a rapidly increasing temperature condition in the epitaxial growth process or the rapid thermal process (RTP) (lamp anneal process) as the subsequent process, and then the next process is conducted.

Although the removal of the protective oxide film formed in the above process is effectively and adequately made on the top face as the reaction face, the removal from the bottom face may not be adequately effective since some portion may be shielded or shaded by the susceptor or the like supporting the silicon wafer. In particular, such removal (or etching) of the protective oxide film may be partially blocked in the short term process such as the epitaxial growth process or the lamp anneal process. It is possible to measure the inadequate removal of the protective oxide film from the bottom surface by detecting a clouded area under the converged light or the fluorescent light, or by the haze level distribution measured by the particle counter. Or, it may be detected as particles depending on the measurement conditions.

In the semiconductor device process as the downstream process, a CVD process is conducted with a radiation type thermometer to measure the temperature of the silicon wafer. The temperature is measured by the heat ray emitted from the bottom face of the silicon wafer with the radiation thermometer and the measured temperature varies depending on the surface state of the bottom face. Therefore, the deposition rate may not be controlled appropriately because the measured temperature may not be accurate if the bottom face having such an undesirable state (clouded state) is used since the semiconductor device process is controlled based on the temperature actually measured by the radiation thermometer. The etching rate may not be appropriate in the etching process either. Thus, the clouded state on the bottom face of the silicon wafer for the semiconductor raw material is the important quality characteristic to be improved.

As mentioned above, it is strongly desirable to remove completely the protective oxide film formed in the previous process before the lamp anneal process or the epitaxial growth process or the like. However, the removal of the protective oxide film from the bottom face, which is shielded or shaded by the susceptor or the like, in the hydrogen annealing process is not necessarily enough if compared to the case with the top face. The effectiveness of the removal of the protective oxide film may be particularly important for the silicon wafer having the bottom face of the mirror finish. This is because the detailed feature of the bottom face is apt to get attention as the quality of the bottom face due to the mirror finish.

Thus, it is plausible that the undesired state (clouded state) of the bottom face as mentioned above was generated by the micro roughness caused by the uneven migration of silicon atoms since the removal of the protective oxide films was prevented partially.

According to the present invention, the cleaning process before the lamp annealing process or the epitaxial growth process may comprise a process with a dilute hydrofluoric acid (HF) and a subsequent process with a pure water (DIW). In this way, the thus-formed oxide films can be easily removed even on the bottom face where the reduction reaction is hard to occur because the bottom face is hidden behind the susceptor. Therefore, it is believed that the migration of silicon atoms occurs evenly so as to obtain the bottom face without any clouded areas.

(2) The method of manufacturing the silicon wafer according to the above (1) wherein the process with the hydrofluoric acid (HF) and the subsequent process with the pure water (DIW) are applied to the bottom face which is on the opposite side of a face for a device process of the silicon wafer.

According to the present invention, both top and bottom faces of the silicon wafer may be subject to the process with the hydrofluoric acid (HF) and the subsequent process with the pure water (DIW). However, it is preferable to apply the process with the hydrofluoric acid (HF) and the subsequent process with the pure water (DIW) as described above to the bottom face since the protective oxide films on the top surface are efficiently removed from the top face due to the configuration of the device in the next process. Also, it is more preferable to apply the process and the subsequent process only to the bottom surface. That is, it is more preferable that the protective oxide film on the bottom face is easier to remove than that on the top face.

(3) The method of manufacturing the silicon wafer according to the above (1) or (2), comprising: a surface oxidization process with an aqueous ozone solution before the process with the hydrofluoric acid (HF) and the subsequent process with the pure water (DIW).

The surface oxide films formed with the aqueous ozone solution tend to be stronger than those formed with the pure water after the surface oxide films are removed in the process with the hydrofluoric acid, for example. Conversely, the oxide films formed in the process with the pure water are easier to remove than the surface oxide films formed in the process with the aqueous ozone solution.

As mentioned above, in the present invention, the protective oxide films on the bottom face are efficiently removed although it is likely that the etching is partially blocked on the bottom face as opposed to the top face such that it is unlikely that the clouded areas on the bottom face are detected by the converged light or the fluorescent light, or by the particle counter. Therefore, the preferable appearance quality on the bottom face can be obtained.

As mentioned above, the embodiment according to the invention by the inventors is explained. The present invention, however, is not limited to the present embodiment and may be modified in various ways without departing from the scope and spirits of the present invention.

What is claimed is:

1. A method of manufacturing a silicon wafer comprising the steps of: cleaning a silicon wafer with top and bottom faces processed to a mirror finish; and conducting a rapid thermal process (RTP) or an epitaxial growth process,
   wherein the cleaning step comprises:
   dipping the silicon wafer in an aqueous ozone solution;
   dipping the silicon wafer in hydrofluoric acid;
   dipping the silicon wafer in another aqueous ozone solution;
   processing only a bottom surface of the silicon wafer with dilute hydrofluoric acid (HF); and
   subsequently processing only the bottom surface of the silicon wafer with pure water (DIW) by showering the pure water on the bottom surface, wherein:
   the foregoing steps are conducted in the foregoing order; and
   the processing of only a bottom surface of the silicon wafer with dilute hydrofluoric acid (HF) and the subsequent processing of only the bottom surface of the silicon wafer with pure water (DIW) are conducted in a last stage of the cleaning step.

2. The method of manufacturing the silicon wafer according to claim 1 wherein dilute hydrofluoric acid (HF) is utilized in the processing step with the hydrofluoric acid (HF).

3. The method of manufacturing the silicon wafer according to claim 2 wherein a vapor of the hydrofluoric acid (HF) is applied only to the bottom surface of the silicon wafer.

4. The method of manufacturing the silicon wafer according to claim 2 wherein the processing step with the dilute hydrofluoric acid (HF) is conducted by a spin cleaning.

5. The method of manufacturing the silicon wafer according to claim 2 wherein:
   the silicon wafer subject to the last stage of the cleaning step has an oxide film on a surface, and
   the rapid thermal process (RTP) or the epitaxial growth process comprises the steps of: an oxide film removing process for removing the oxide film and a process for processing the top surface as the top surface is fully exposed.

6. The method of manufacturing the silicon wafer according to claim 3, wherein:
   the rapid thermal process (RTP) is conducted right after the cleaning step; and
   the rapid thermal process (RTP) is a lamp anneal process.

* * * * *